United States Patent
Su et al.

(10) Patent No.: US 8,415,799 B2
(45) Date of Patent: Apr. 9, 2013

(54) DUAL DAMASCENE INTERCONNECT IN HYBRID DIELECTRIC

(75) Inventors: Yi-Nien Su, Kaohsiung (TW); Jyu-Horng Shieh, Hsin-Chu (TW); Hun-Jan Tao, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1412 days.

(21) Appl. No.: 11/172,442

(22) Filed: Jun. 30, 2005

(65) Prior Publication Data

US 2007/0001306 A1 Jan. 4, 2007

(51) Int. Cl.
*H01L 23/48* (2006.01)

(52) U.S. Cl. .................... 257/758; 257/E21.579

(58) Field of Classification Search ........... 257/E21.579, 257/758
See application file for complete search history.

(56) References Cited

U.S. PATENT DOCUMENTS

| | | | |
|---|---|---|---|
| 6,083,822 A * | 7/2000 | Lee | 438/624 |
| 6,156,648 A | 12/2000 | Huang | 438/654 |
| 6,184,128 B1 * | 2/2001 | Wang et al. | 438/637 |
| 6,372,631 B1 | 4/2002 | Wang et al. | 438/624 |
| 6,521,524 B1 | 2/2003 | Wang et al. | 438/637 |
| 6,753,249 B1 * | 6/2004 | Chen et al. | 438/637 |
| 6,878,615 B2 * | 4/2005 | Tsai et al. | 438/618 |
| 2003/0218256 A1 * | 11/2003 | Merchant et al. | 257/774 |
| 2004/0175933 A1 * | 9/2004 | Shishida et al. | 438/637 |
| 2005/0142862 A1 * | 6/2005 | Chun | 438/639 |
| 2005/0146040 A1 * | 7/2005 | Cooney et al. | 257/758 |
| 2005/0215051 A1 * | 9/2005 | Yang et al. | 438/624 |
| 2006/0234403 A1 * | 10/2006 | Li et al. | 438/14 |

* cited by examiner

*Primary Examiner* — Kimberly Rizkallah
*Assistant Examiner* — Timor Karimy
(74) *Attorney, Agent, or Firm* — McClure, Qualey & Rodack, LLP

(57) ABSTRACT

A semiconductor device. A diffusion barrier layer overlies a substrate. An adhesion promoting layer overlies the diffusion barrier layer. A first dielectric layer between the diffusion barrier layer and the adhesion promoting layer comprises at least one via opening through the diffusion barrier layer and the adhesion promoting layer. A second dielectric layer overlies the adhesion promoting layer, comprising a trench opening above the via opening. A metal interconnect fills the via and trench openings.

13 Claims, 13 Drawing Sheets

DUAL DAMASCENE INTERCONNECT IN HYBRID DIELECTRIC

BACKGROUND

The present invention relates to semiconductor fabrication, and in particular to dual damascene interconnects formed in a hybrid dielectric and methods for fabricating the same.

In the fabrication of semiconductor devices, the size of semiconductor devices has been continuously reduced in order to increase device density. Accordingly, multiple layers may be required to provide a multi-layered interconnect structure. A typical process for forming a multi-layered interconnect structure is a dual damascene process. In the dual damascene process, via openings are first anisotropically etched through an inter-metal dielectric (IMD) layer by conventional photolithography and etching. A second anisotropically etched opening referred to as a trench opening is then formed overlying one or more of the via openings by second photolithography and etching. The via openings and the trench opening together make up the dual damascene structure, subsequently filled with metal followed by CMP to planarize the wafer process surface in preparation for formation of another overlying layer or level in a multi-layered semiconductor device.

In order to lower the RC of the semiconductor device and improve its performance, low k dielectric layer have been increasingly investigated. Low k dielectric materials, however, present a more difficult to control etching profile than high k materials and may be damaged in a conventional dual damascene.

U.S. Pat. No. 6,521,524 to Wang et al. discloses a via filling dual damascene process using a middle stop layer. In this method, however, a drawback is susceptibility of low-k materials to etching damage during removal of stop layers, whereby low-k materials may be damaged by overetching to detrimentally alter etch opening profiles as well as degrading dielectric constant properties. The various problems included in interconnect formation processes with low-K materials are exacerbated in higher aspect ratio openings and in dual damascene formation processes where multiple etching steps are conducted in the manufacturing process.

Thus a need exists in the integrated circuit manufacturing art to develop a more robust dual damascene interconnect whereby etching damage to low-K material is reduced, while electrical and mechanical properties of the interconnect are improved, thereby improving device yield and reliability.

SUMMARY

Semiconductor devices and dual damascene processes for fabricating the same are provided. An embodiment of a semiconductor device comprises a diffusion barrier layer overlying a substrate. An adhesion promoting layer overlies the diffusion barrier layer. A first dielectric layer between the diffusion barrier layer and the adhesion promoting layer comprises at least one via opening through the diffusion barrier layer and the adhesion promoting layer. A second dielectric layer overlies the adhesion promoting layer, comprising a trench opening above the via opening. A metal interconnect is filled in the via and trench openings.

Another embodiment of a semiconductor device comprises a diffusion barrier layer overlying a substrate. A first dielectric layer overlies the diffusion barrier layer, comprising at least one via opening through the diffusion barrier layer, with spacers overlying sidewalls thereof. An adhesion promoting layer overlies the first dielectric layer. A second dielectric layer overlies the adhesion promoting layer, comprising a trench opening above the via opening through the adhesion promoting layer. A metal interconnect is filled in the via and trench openings.

Yet another embodiment of a semiconductor device comprises a diffusion barrier layer overlying a substrate. A first adhesion promoting layer overlies the diffusion barrier layer. A first dielectric layer between the diffusion barrier layer and the first adhesion promoting layer comprises at least one via opening through the diffusion barrier layer and the first adhesion promoting layer, with spacers overlying sidewalls thereof. A second adhesion promoting layer overlies the first adhesion promoting layer. A second dielectric layer overlies the second adhesion promoting layer, comprising a trench opening above the via opening and through the second adhesion promoting layer. A metal interconnect is filled in the via and trench openings.

An embodiment of a dual damascene process for fabricating a semiconductor device comprises successively forming a diffusion barrier layer, a first dielectric layer and an adhesion promoting layer overlying a substrate. At least one via opening is formed through the adhesion promoting layer, the first dielectric layer and the diffusion barrier layer by etching to expose the substrate. A second dielectric layer is formed overlying the adhesion promoting layer and fills the via opening. The second dielectric layer is etched to form a trench opening above the via opening while simultaneously removing the second dielectric layer from the via opening to expose the substrate. The via and trench openings are filled with a metal.

Another embodiment of a dual damascene process for fabricating a semiconductor device comprises successively forming a diffusion barrier layer and a first dielectric layer overlying a substrate. At least one via opening is formed through the first dielectric layer and the diffusion barrier layer by etching to expose the substrate. A conformable adhesion promoting layer is formed overlying the first dielectric layer and lines the via opening. A second dielectric layer is formed overlying the adhesion promoting layer and fills the via opening. The second dielectric layer is etched to form a trench opening above the via opening while simultaneously removing the second dielectric layer from the via opening to expose the adhesion promoting layer. The exposed adhesion promoting layer is anisotropically etched to form spacers over the sidewalls of the via opening. The via and trench openings are filled with a metal.

Yet another embodiment of a dual damascene process for fabricating a semiconductor device comprises successively forming a diffusion barrier layer, a first dielectric layer and a first adhesion promoting layer overlying a substrate. At least one via opening is formed through the first adhesion promoting layer, the first dielectric layer and the diffusion barrier layer by etching to expose the substrate. A conformable second adhesion promoting layer is formed overlying the first adhesion promoting layer and lines the via opening. A second dielectric layer is formed overlying the second adhesion promoting layer and fills the via opening. The second dielectric layer is etched to form a trench opening above the via opening while simultaneously removing the second dielectric layer from the via opening to expose the second adhesion promoting layer. The exposed second adhesion promoting layer is anisotropically etched to form spacers over the sidewalls of the via opening. The via and trench openings are filled with a metal.

Further another embodiment of a dual damascene process for fabricating a semiconductor device comprises successively forming a diffusion barrier layer, a first dielectric layer and a first adhesion promoting layer overlying a substrate. At least one via opening is formed through the first adhesion promoting layer, the first dielectric layer and the diffusion barrier layer by etching to expose the substrate. A conformable second adhesion promoting layer is formed overlying the first adhesion promoting layer and lines the via opening. The first adhesion promoting layer comprises a material different from the second adhesion promoting layer. A second dielectric layer is formed overlying the second adhesion promoting layer and fills the via opening. The second dielectric layer is etched to form a trench opening above the via opening while simultaneously removing the second dielectric layer from the via opening to expose the second adhesion promoting layer. The exposed second adhesion promoting layer is removed. The via and trench openings are filled with a metal.

BRIEF DESCRIPTION OF THE DRAWINGS

The invention will become more fully understood from the detailed description given hereinbelow and the accompanying drawings, given by way of illustration only and thus not intended to be limitative of the invention.

FIGS. 2E-1 to 2F-1 are cross-sections of another embodiment of method steps following FIG. 2D.

FIGS. 3E-1 to 3F-1 are cross-sections of another embodiment of method steps following FIG. 3D.

FIGS. 3E-2 to 3F-2 are cross-sections of further another embodiment of method steps following FIG. 3D.

DESCRIPTION

The present invention is directed to a dual damascene interconnect structure and method of forming the same. The present invention overcomes problems of forming dual damascene interconnect in low-k materials. The advantages of the present invention include improving control of etching profiles, as well as avoiding damage to low-K materials by etching. The dual damascene structure of the present invention thereby provides a more robust interconnect structure including improved mechanical strength and improved electrical transport properties in addition to increasing device yield and reliability.

Figure 1A:
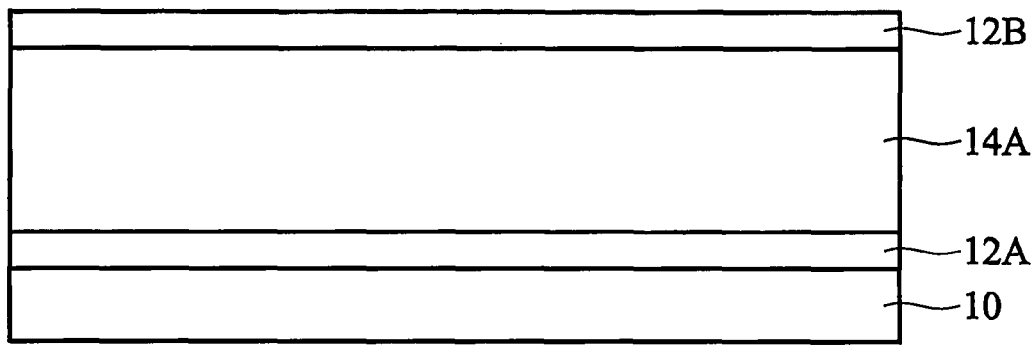
FIGS. 1A to 1E are cross-sections of an embodiment of a method for fabricating a dual damascene interconnect in a hybrid intermetal dielectric layer of the invention.
Figure 1B:
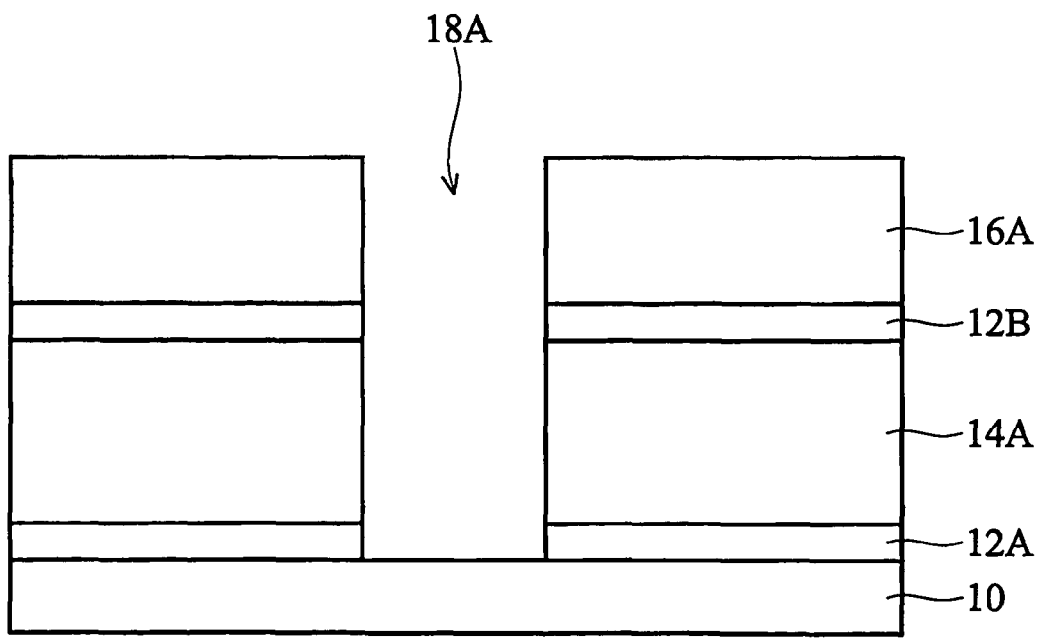
Figure 1C:
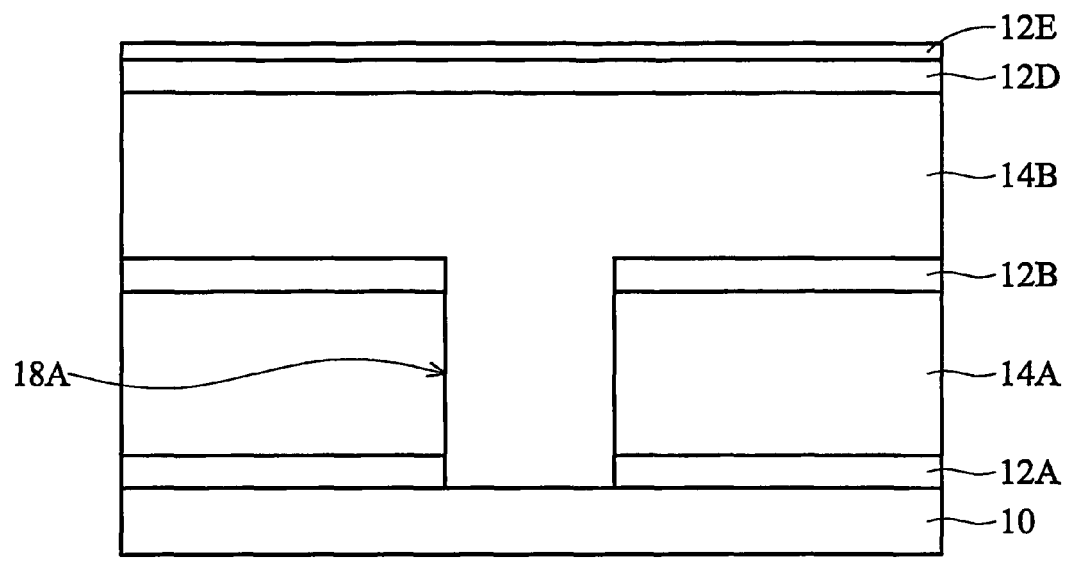
Figure 1D:
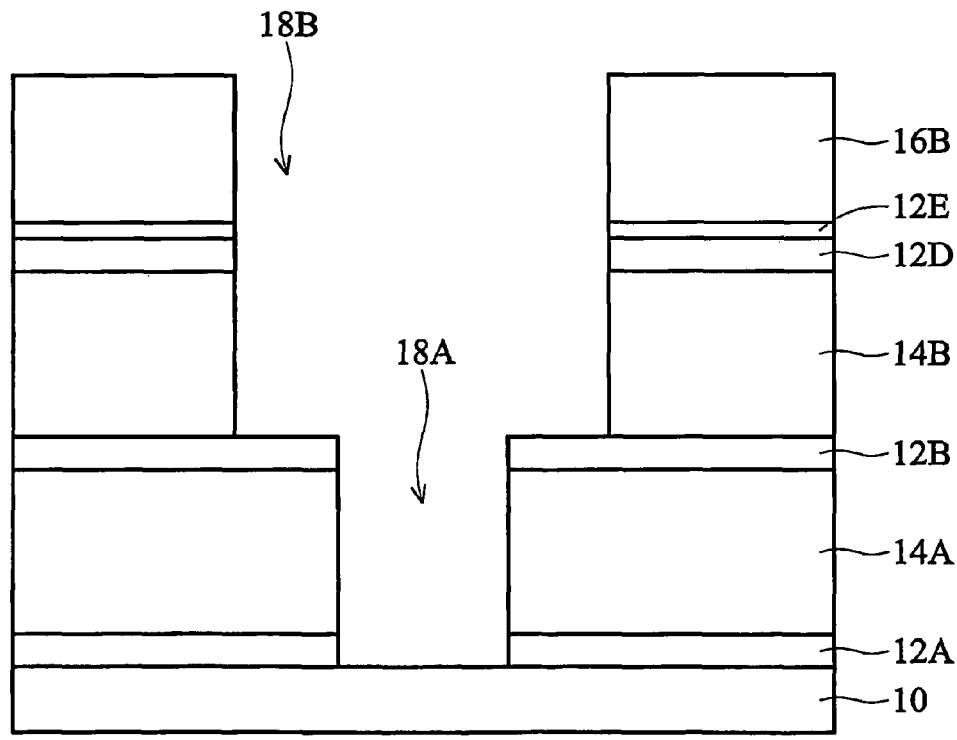
Figure 1E:
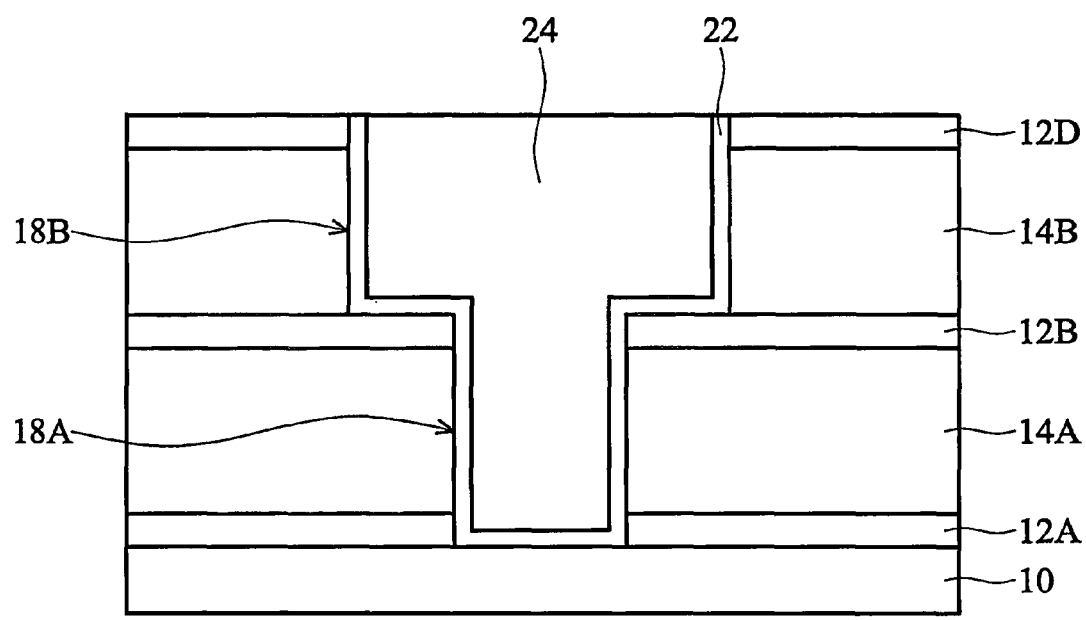

FIG. 1E illustrates an embodiment of a semiconductor device with a dual damascene interconnect in a hybrid intermetal dielectric (IMD) layer.☐ The semiconductor device comprises a diffusion barrier layer 12A overlying a substrate 10. A first dielectric layer 14A overlies the diffusion barrier layer 12A, serving as a portion of the hybrid IMD layer. An adhesion promoting layer 12B overlies the first dielectric layer 14A. In this embodiment, the first dielectric layer 14A between the diffusion barrier layer 12A and the adhesion promoting layer 12B comprises at least one via opening 18A through the diffusion barrier layer 12A and the adhesion promoting layer 12B. A second dielectric layer 14B overlies the adhesion promoting layer 12B, serving as another portion of the hybrid IMD layer. Moreover, the second dielectric layer 14B comprises a trench opening 18B above the via opening 18A to create a dual damascene opening in the Hybrid IMD layer. A metal interconnect is filled in the via and trench openings 18A and 18B. The metal interconnect may comprise a conductive layer 24 and a conformable metal barrier layer 22 lining the dual damascene opening.

FIGS. 1A to 1E illustrate an embodiment of a method for fabricating a dual damascene interconnect in a hybrid IMD layer. In FIG. 1A, a substrate 10 is provided. The substrate 10, such as a silicon substrate or other semiconductor substrate, may contain a variety of elements, including, for example, transistors, resistors, and other semiconductor elements as is well known in the art. The substrate 10 may also contain a conductive region (not shown), such as a doping region of a transistor or an inlaid metal layer. In order to simplify the diagram, a flat substrate is depicted. A diffusion barrier layer 12A, a first dielectric layer 14A and an adhesion promoting layer 12B are successively formed overlying the substrate 10. In this embodiment, the diffusion barrier layer 12A may comprise organic or inorganic material, such as silicon nitride (e.g., SiN, $Si_3N_4$), silicon oxynitride (e.g., SiON), silicon carbide (e.g., SiC), silicon oxycarbide (e.g., SiOC), or combinations thereof. The diffusion barrier layer 12A is typically formed to a thickness of about 200 to 700 Å by conventional CVD, LPCVD, PECVD, or HDP-CVD. Moreover, the first dielectric layer 14A is preferably formed by CVD, LPCVD, PECVD, or HDP-CVD and may comprise inorganic material, such as a fluorinated silicate glass (FSG), carbon doped oxide, methyl silsesquioxane (MSQ), hydrogen silsesquioxane (HSQ), or fluorine tetra-ethyl-orthosilicate (FTEOS). The dielectric constant of the first dielectric layer 14A is preferably about 4.0 or lower, more preferably, about 3.0 or lower. The adhesion promoting layer 12B may comprise SiN, SiON, SiC, SiOC, SiO, organic materials, or combinations thereof. The adhesion promoting layer 12B may also advantageously function as an etch stop layer in a subsequent trench etching process and/or as an anti-reflective layer (ARL) in a subsequent via patterning. The thickness of the adhesion promoting layer 12B is typically between about 100 to 800 Å.

In FIG. 1B, a first photoresist layer 16A with at least one via pattern is formed on the adhesion promoting layer 12B by conventional photolithography. A conventional etching process, such as a reactive ion etching (RIE), is then carried out to form at least one via opening 18A through the adhesion promoting layer 12B, the first dielectric layer 14A and the diffusion barrier layer 12A to expose the substrate 10.

In FIG. 1C, following via etching, the first photoresist layer 16A is removed according to a conventional chemical stripping or plasma ashing. A second dielectric layer 14B is formed overlying the adhesion promoting layer 12B and fills the via opening 18A. The second dielectric layer 14B may comprise organic material, such as SILK™, FLARE (manufactured by Allied Chemical) or other low-k organic dielectric material. The low-k organic material is preferably deposited by a conventional spin coating to achieve acceptable gap filling. The second dielectric layer 14B preferably has a dielectric constant of 2.0 to 3.0. A capping layer 12D may optionally be formed over the second dielectric layer 14B, serving as a hard mask for subsequent trench line etching as well as a polishing stop for subsequent chemical mechanical polishing (CMP). The capping layer 12D may additionally function as an ARL, or a separate ARL (e.g., 12E) may be deposited over the capping layer 12D. The capping layer 12D is preferably formed of one or more of SiN, SiON, SiC, SiO, and SiOC.

In FIG. 1D, a second photoresist layer 16B with a trench pattern is formed over the second dielectric layer 14B by conventional photolithography. The ARL 12E, the capping layer 12D and the second dielectric layer 14B are successively etched using the second photoresist layer 16B as a mask to form a trench opening 18B above the via opening 18A and stop on the adhesion promoting layer 12B. During formation of the trench opening 18B, the second dielectric layer 14B filling the via opening 18A is simultaneously removed to re-expose the substrate 10. As a result, a dual damascene opening is completed.

In FIG. 1E, following the trench etching, conventional stripping or ashing is then carried out to remove the second photoresist layer 16B. Next, a conductive layer (not shown), such as copper, aluminum, or other well known interconnect material, is formed over the second dielectric layer 14B and fills the trench and via openings 18B and 18A. The excess conductor layer over the capping layer 12D and the underlying ARL 12E are removed by polishing, such as CMP, to leave a portion of conductive layer 24 in the trench and via openings 18B and 18A, serving as a metal interconnect and completing the interconnect fabrication. Typically, a conformable metal barrier layer 22, such as TiN, TaN, or Ti may line the trench and via openings 18B and 18A prior to deposition of the interconnect material.

Since the diffusion barrier layer 12A has been previously etched through during via definition, there is no requirement for additional etching to open the bottom diffusion barrier layer 12A under the via opening 18A. Accordingly, the first and second dielectric layers 14A and 14B are protected from damage, thereby maintaining via opening 18A profile. Moreover, since the trench etching is stopped on the adhesion promoting layer 12B, a lower RC in trench line portion can be achieved. Accordingly, device yield, performance and reliability are improved.

Figure 2A:
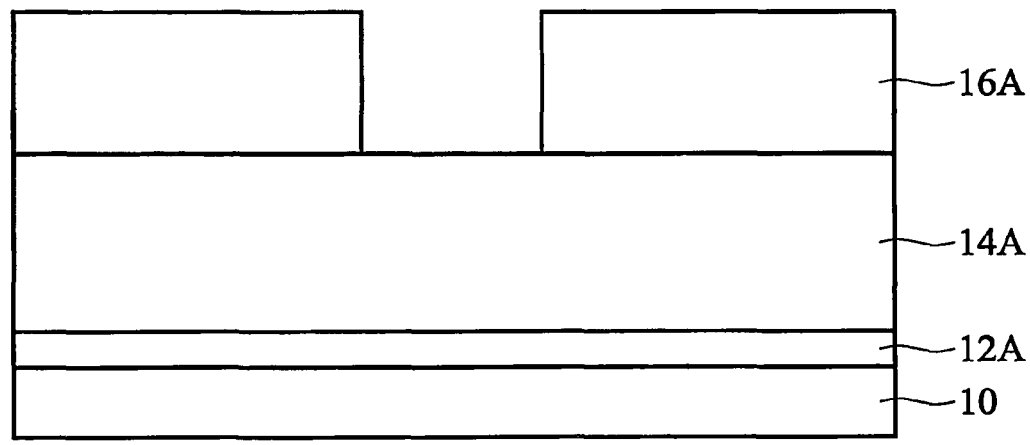
FIGS. 2A to 2F are cross-sections of an embodiment of a method for fabricating a dual damascene interconnect in a hybrid intermetal dielectric layer of the invention.
Figure 2B:
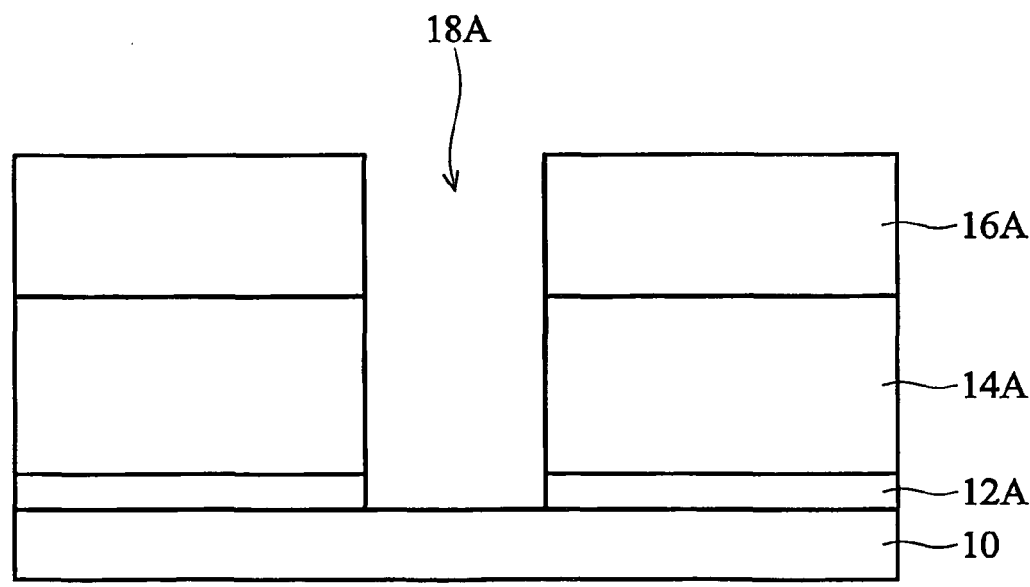
Figure 2C:
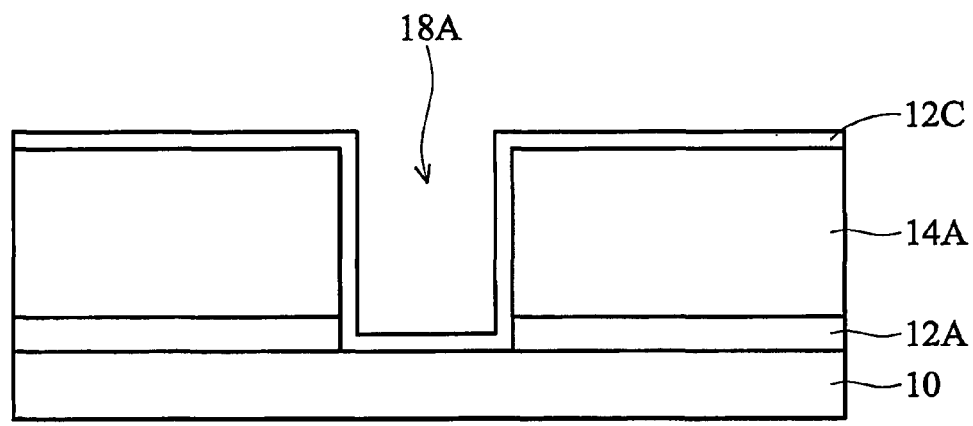
Figure 2D:
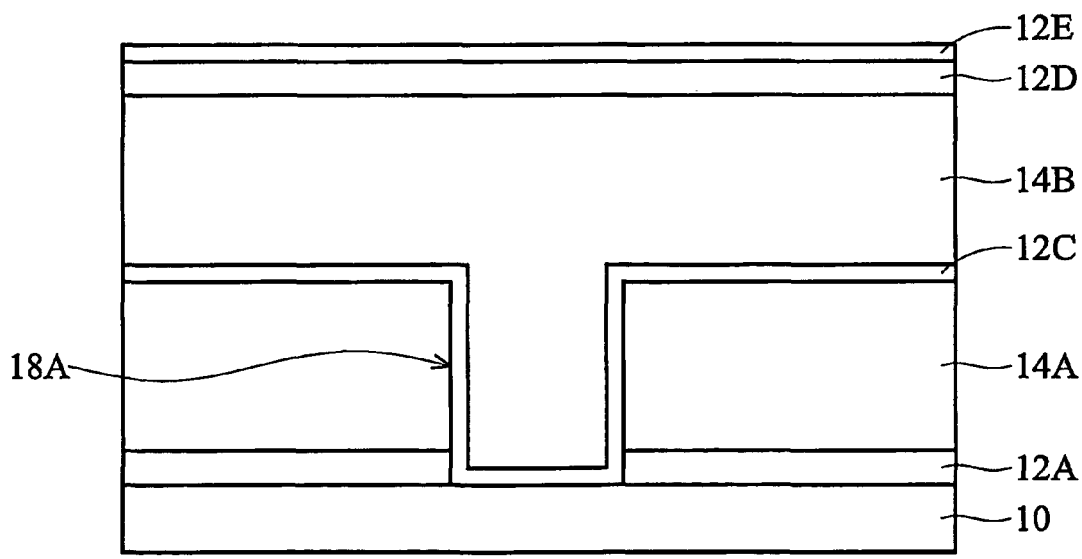
Figure 2E:
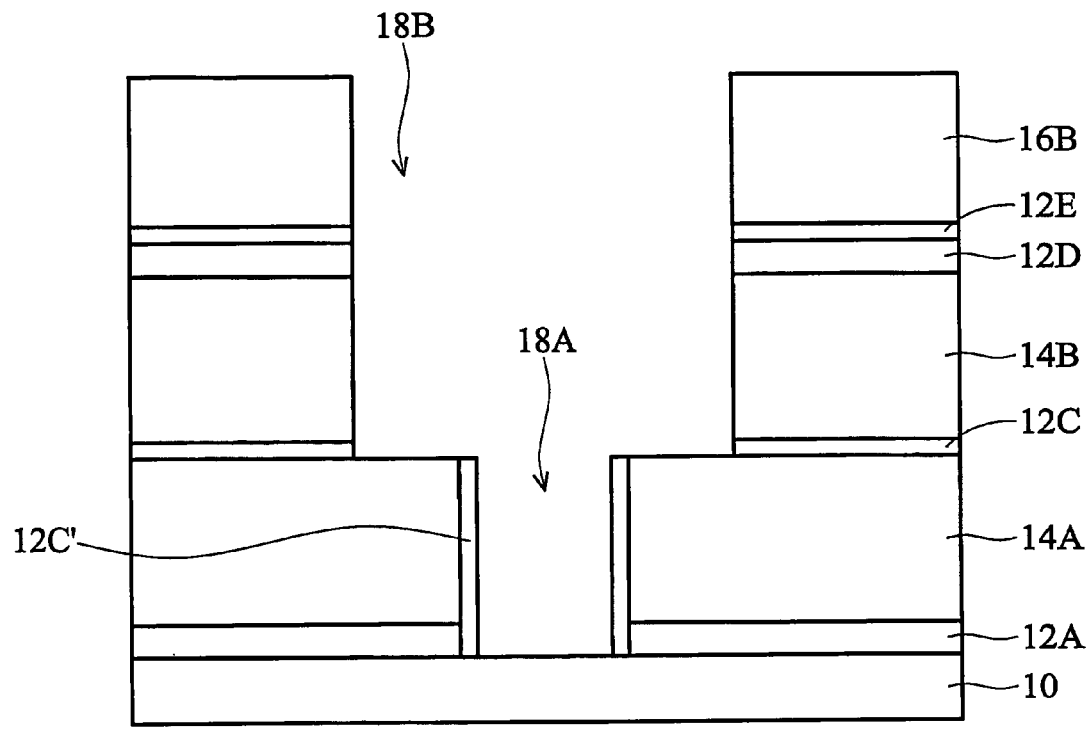
Figures 1, 2E:
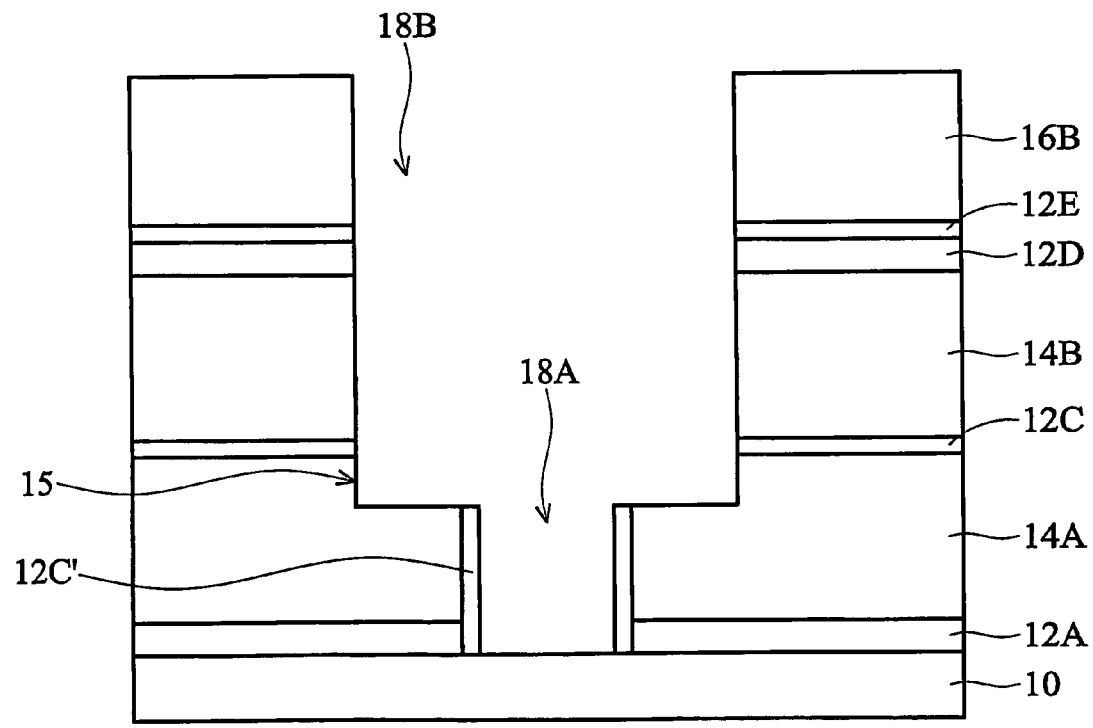
Figure 2F:
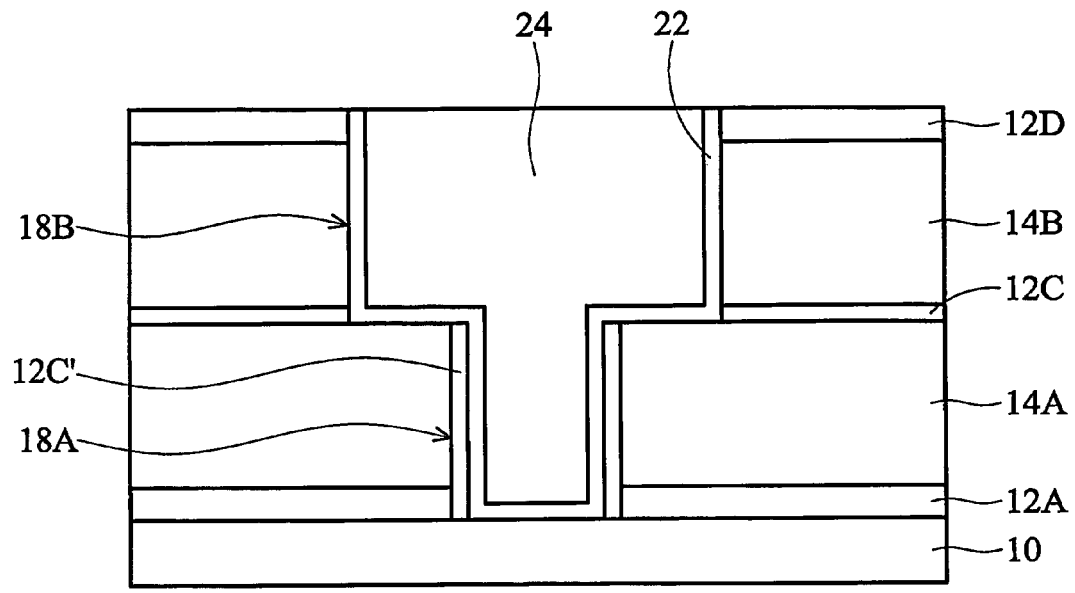
Figures 1, 2F:
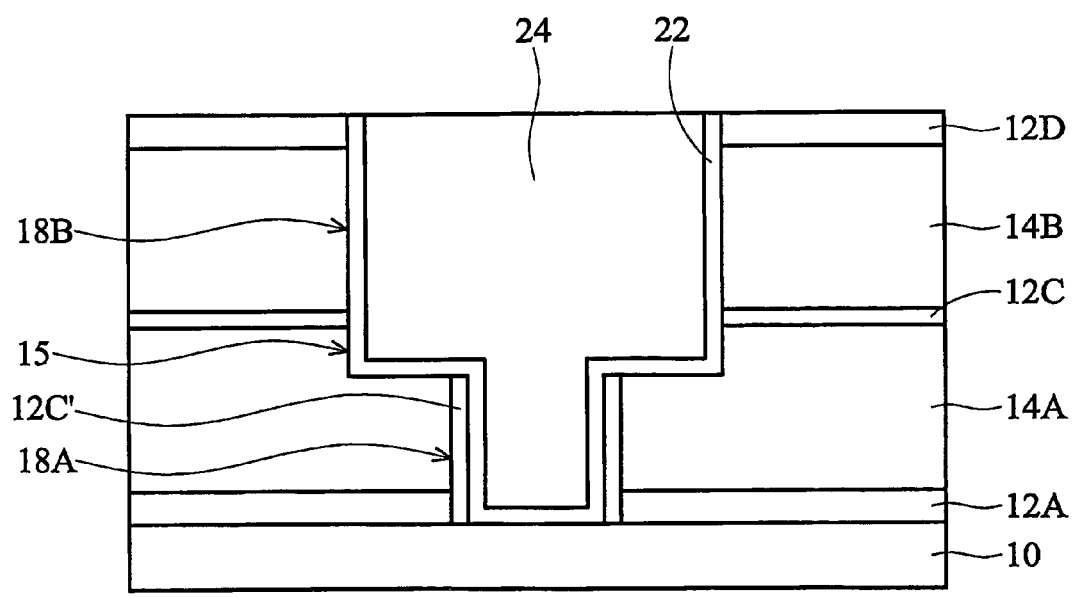

FIG. 2F illustrates another embodiment of a semiconductor device with a dual damascene interconnect, in which the same reference numbers as FIG. 1E are used. The semiconductor device comprises a diffusion barrier layer 12A overlying a substrate 10. A first dielectric layer 14A overlies the diffusion barrier layer 12A, comprising at least one via opening 18A through the diffusion barrier layer 12A. Spacers 12C' overlie sidewalls of the via opening 18A. An adhesion promoting layer 12C overlies the first dielectric layer 14A. A second dielectric layer 14B overlies the adhesion promoting layer 12C, comprising a trench opening 18B above the via opening 18A and through the adhesion promoting layer 12C. A metal interconnect is filled in the via and trench openings 18A and 18B. The metal interconnect may comprise a copper layer 24 and a conformable metal barrier layer 22 lining the dual damascene opening. Additionally, in some embodiments, the first dielectric layer 14A may comprise a recess 15 between the via and trench openings 18A and 18B, such that the trench portion of the metal interconnect extends into the first dielectric layer 14A, as shown in FIG. 2F-1.

FIGS. 2A to 2F illustrate another embodiment of a method for fabricating a dual damascene interconnect in a hybrid IMD layer, in which the same reference numbers as FIGS. 1A-1E are used, wherefrom like descriptions are omitted.

In FIG. 2A, a diffusion barrier layer 12A and a first dielectric layer 14A are successively formed overlying the substrate 10. A first photoresist layer 16A with at least one via pattern is formed on the first dielectric layer 14A. Etching is then carried out to form at least one via opening 18A through the first dielectric layer 14A and the diffusion barrier layer 12A to expose the substrate 10, as shown in FIG. 2B.

In FIG. 2C, following via etching, the first photoresist layer 16A is removed. A conformable adhesion promoting layer 12C is formed on the first dielectric layer 14A to line the via opening 18A. In this embodiment, the adhesion promoting layer 12C may comprise SiN, SiON, SiC, SiOC, SiO, organic materials, or combinations thereof.

In FIG. 2D, a second dielectric layer 14B is formed overlying the adhesion promoting layer 12C and fills the via opening 18A. A capping layer 12D and an overlying ARL 12E may optionally be formed over the second dielectric layer 14B.

In FIG. 2E, a second photoresist layer 16B with a trench pattern is formed over the second dielectric layer 14B. The ARL 12E, the capping layer 12D and the second dielectric layer 14B are successively etched using the second photoresist layer 16B as a mask to form a trench opening 18B above the via opening 18A and stop on the adhesion promoting layer 12C. During formation of the trench opening 18B, the second dielectric layer 14B filling the via opening 18A is simultaneously removed to re-expose the substrate 10. Next, anisotropic etching is performed on the adhesion promoting layer 12C to form spacers 12C' over sidewalls of the via opening 18A.

In FIG. 2F, following the trench etching, the second photoresist layer 16B is removed. Next, the trench and via openings 18B and 18A are filled with a conductive layer 24 comprising metal to complete the interconnect fabrication. A conformable metal barrier layer 22 may line the trench and via openings 18B and 18A prior to deposition of the interconnect material.

In some embodiments, after formation of the spacers 12C', the first dielectric layer 14A and the spacers 12C' are further etched to form a recess 15 in the first dielectric layer 14A and between the via and trench openings 18A and 18B, as shown in FIG. 2E-1. After filling the dual damascene opening with a conductive layer serving as an interconnect, the trench portion of the metal interconnect extends into the first dielectric layer 14A, as shown in FIG. 2F-1.

Since the diffusion barrier layer 12A has been previously etched through during via definition and the formation of the spacers 12C'. Accordingly, the first and second dielectric layers 14A and 14B are protected from damage, thereby maintaining via opening 18A profile to improve device yield, performance and reliability can be improved.

Figure 3A:
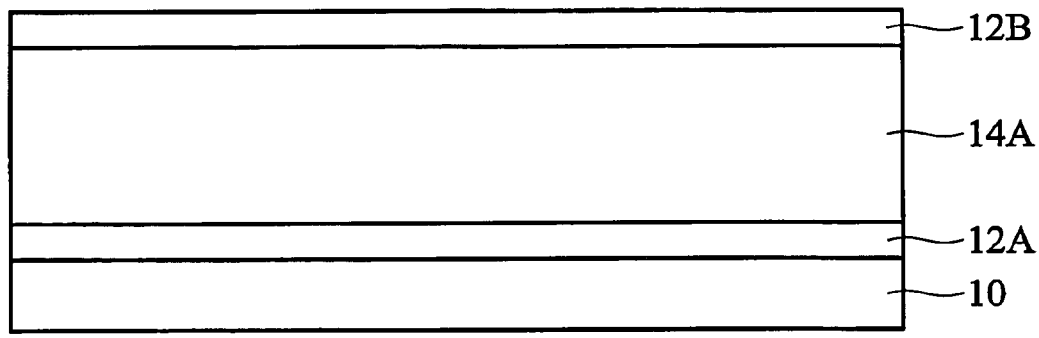
FIGS. 3A to 3F are cross-sections of an embodiment of a method for fabricating a dual damascene interconnect in a hybrid intermetal dielectric layer of the invention.
Figure 3B:
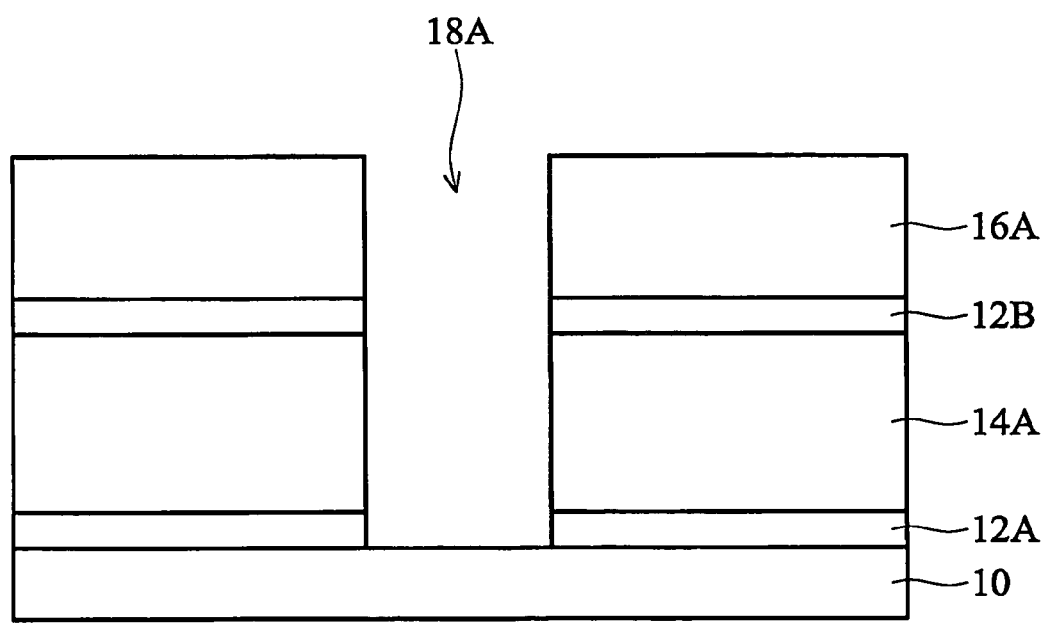
Figure 3C:
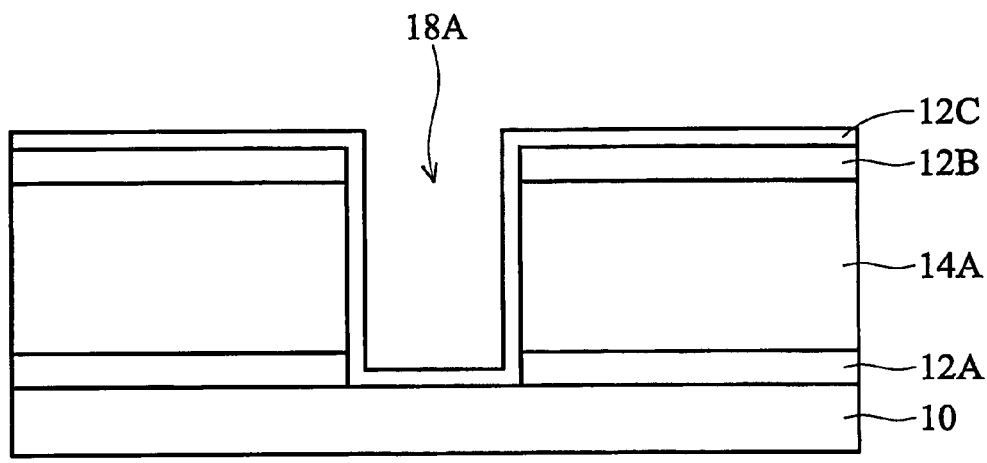
Figure 3D:
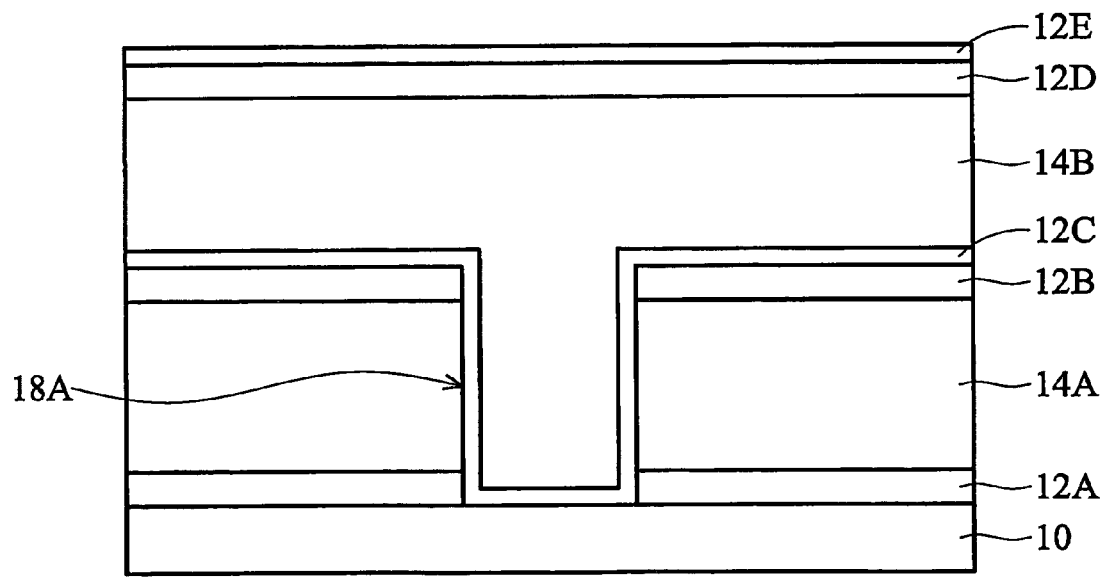
Figure 3E:
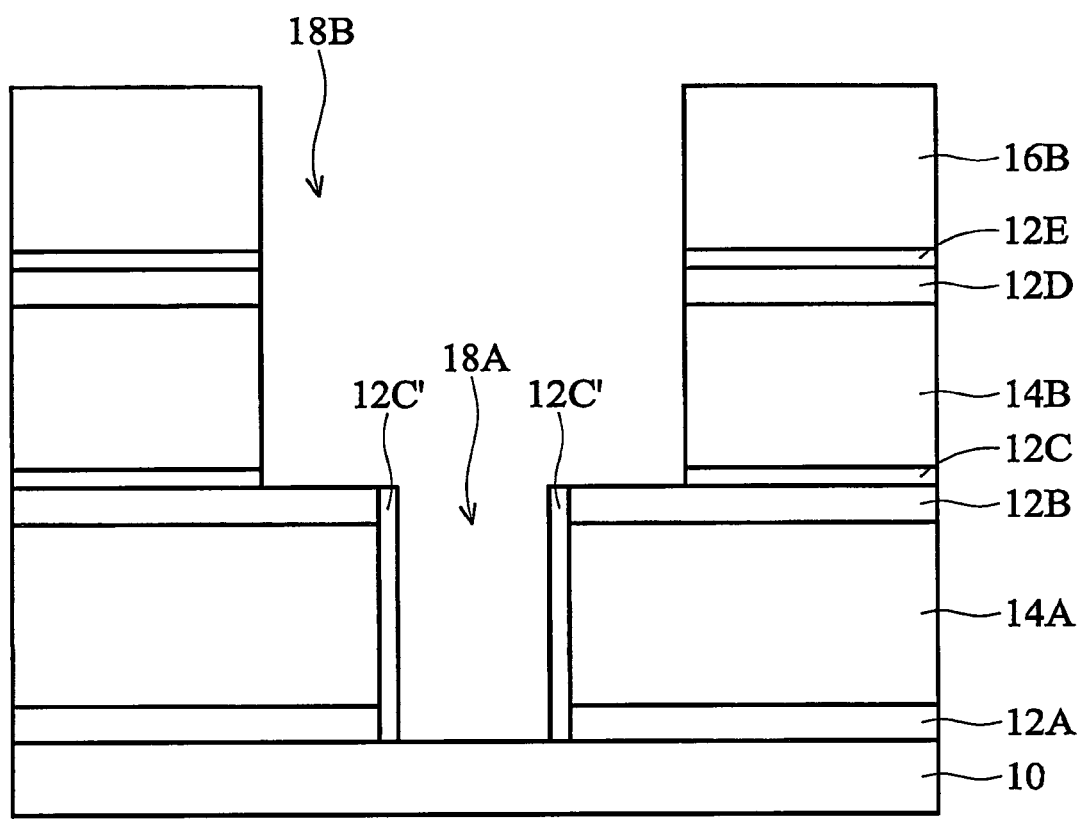
Figures 1, 3E:
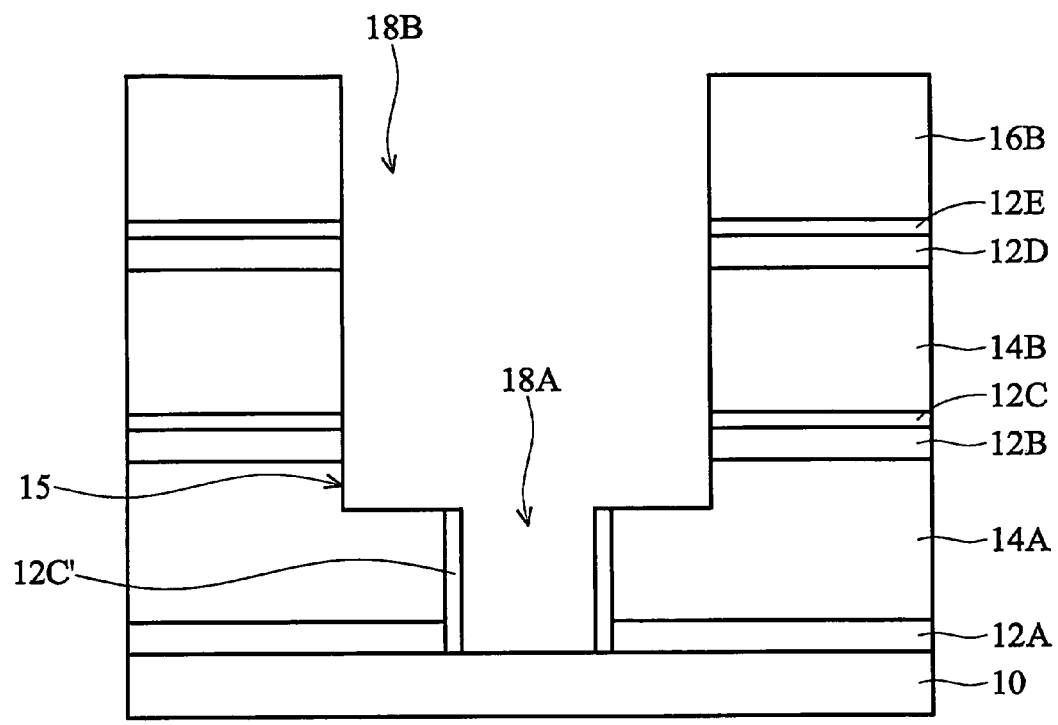
Figures 2, 3E:
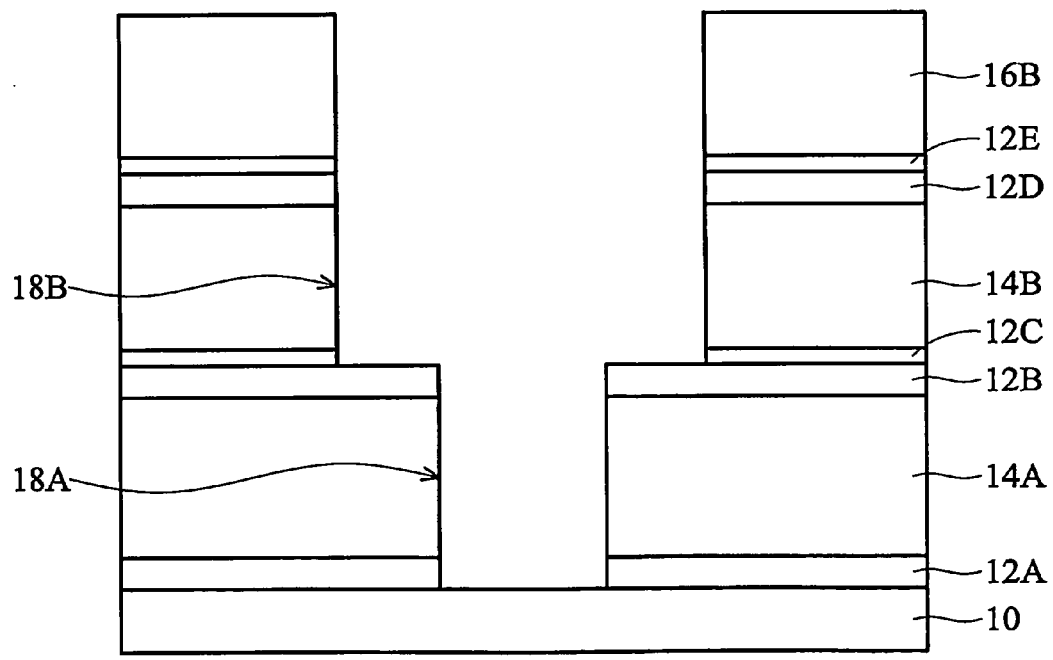
Figure 3F:
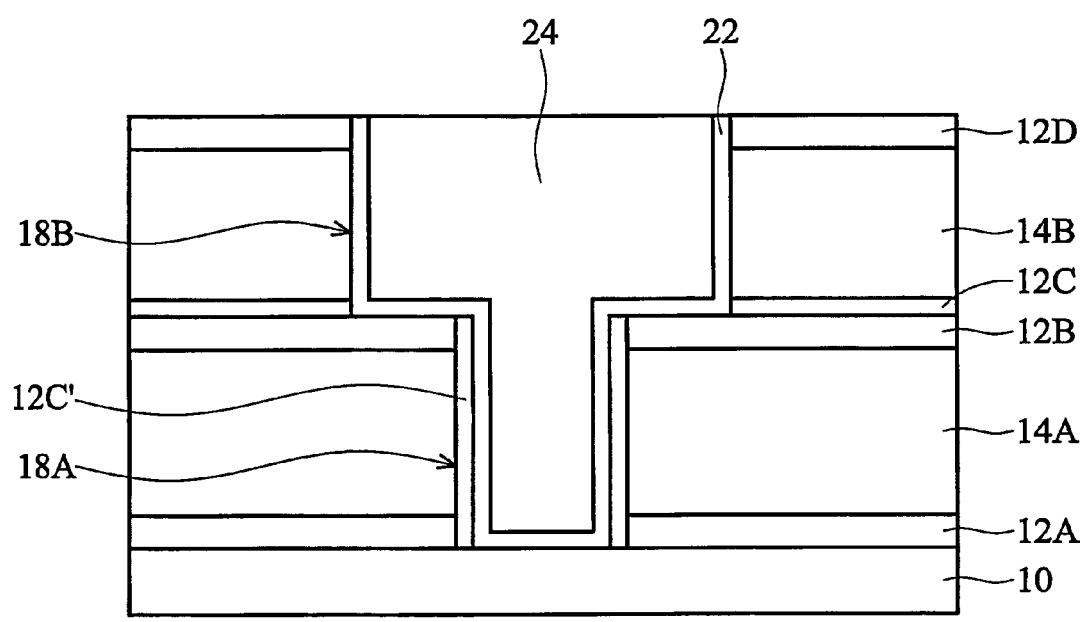
Figures 1, 3F:
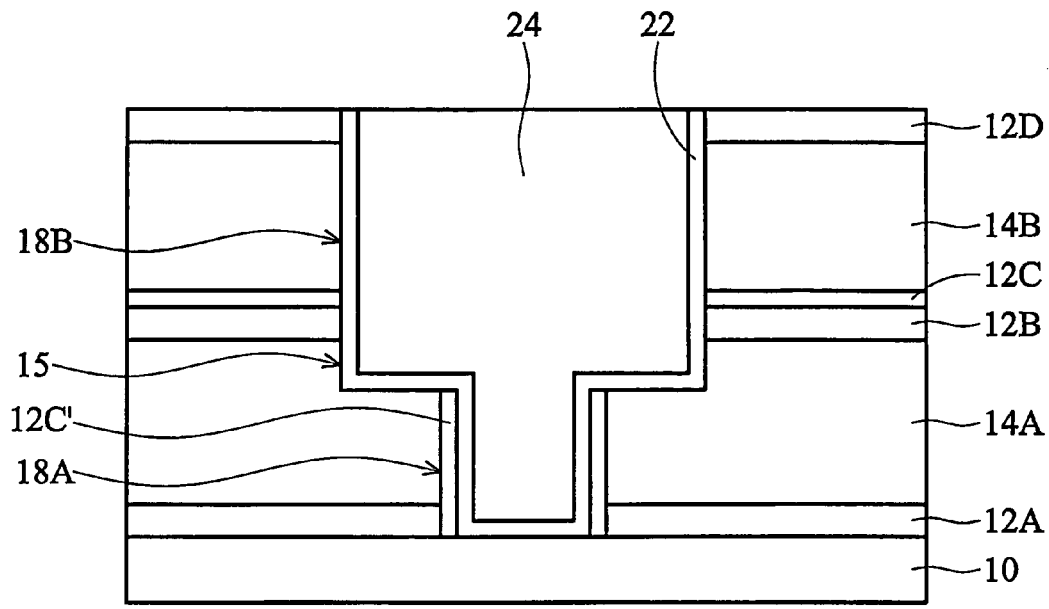
Figures 2, 3F:
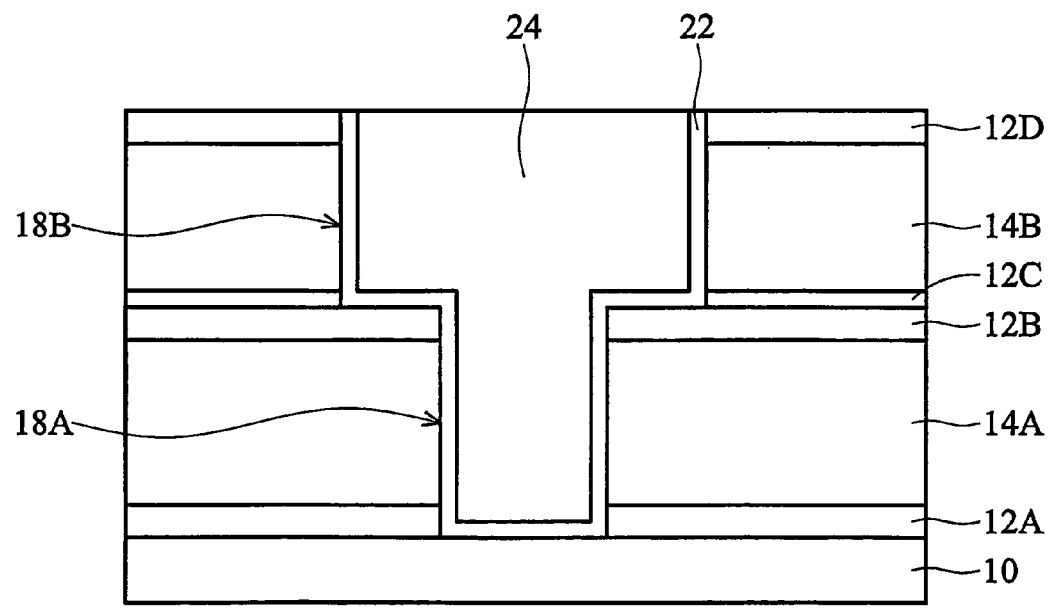

FIG. 3F illustrates yet another embodiment of a semiconductor device with a dual damascene interconnect, in which the same reference numbers as FIG. 1E or 2F are used. The semiconductor device comprises a diffusion barrier layer 12A overlying a substrate 10. A first adhesion promoting layer 12B overlies the diffusion barrier layer 12A. A first dielectric layer 14A between the diffusion barrier layer 12A and the first adhesion promoting layer 12B comprises at least one via opening 18A through the diffusion barrier layer 12A and the first adhesion promoting layer 12B, with spacers 12C' overlying sidewalls of the via opening 18A. A second adhesion promoting layer 12C overlies the first adhesion promoting layer 12B. A second dielectric layer 14B overlies the second adhesion promoting layer 12C, comprising a trench opening 18B above the via opening 18A and through the second adhesion promoting layer 12C. A metal interconnect is filled in the via and trench openings 18A and 18B. The metal interconnect may comprise a conductive layer 24 and a conformable metal barrier layer 22 lining the dual damascene opening.

Additionally, in some embodiments, the first dielectric layer 14A may comprise a recess 15 between the via and trench openings 18A and 18B, such that the trench portion of the metal interconnect extends into the first dielectric layer 14A, as shown in FIG. 3F-1. Additionally, in some embodiments, the metal interconnect may fill the via openings 18A without spacers between the first dielectric layer 14A and the metal interconnect, as shown in FIG. 3F-2.

FIGS. 3A to 3F illustrate yet another embodiment of a method for fabricating a dual damascene interconnect in a hybrid IMD layer, in which the same reference numbers as FIG. 1A-1E or 2A-2F are used, wherefrom like descriptions are omitted. In FIG. 3A, a diffusion barrier layer 12A, a first dielectric layer 14A and a first adhesion promoting layer 12B are successively formed overlying a substrate 10.

In FIG. 3B, a first photoresist layer 16A with at least one via pattern is formed on the adhesion promoting layer 12B. Etching is then carried out to form at least one via opening 18A through the adhesion promoting layer 12B, the first dielectric layer 14A and the diffusion barrier layer 12A to expose the substrate 10.

In FIG. 3C, following via etching, the first photoresist layer 16A is removed. A conformable second adhesion promoting layer 12C is formed on the first adhesion promoting layer 12B and lines the via opening 18A. In this embodiment, the second adhesion promoting layer 12C may comprise an organic or inorganic material the same as or other than the first adhesion promoting layer 12B.

In FIG. 3D, a second dielectric layer 14B is formed overlying the adhesion promoting layer 12C and fills the via opening 18A. A capping layer 12D and an overlying ARL 12E may optionally be formed over the second dielectric layer 14B.

In FIG. 3E, a second photoresist layer 16B with a trench pattern is formed over the second dielectric layer 14B. The ARL 12E, the capping layer 12D and the second dielectric layer 14B are successively etched using the second photoresist layer 16B as a mask to form a trench opening 18B above the via opening 18A and stop on the second adhesion promoting layer 12C. During formation of the trench opening 18B, the second dielectric layer 14B filling the via opening 18A is simultaneously removed to re-expose the substrate 10. Next, anisotropic etching is performed on the second adhesion promoting layer 12C to form spacers 12C' over sidewalls of the via opening 18A.

In FIG. 3F, following the trench etching, the second photoresist layer 16B is removed. Next, the trench and via openings 18B and 18A are filled with a conductive layer 24 comprising metal to complete the interconnect fabrication. A conformable metal barrier layer 22 may line the trench and via openings 18B and 18A prior to deposition of the interconnect material. In some embodiments, the first dielectric layer 14A and the spacers 12C' may further be etched to form a recess 15 in the first dielectric layer 14A and between the via and trench openings 18A and 18B, as shown in FIG. 3E-1. After filling the dual damascene opening with a conductive layer 24 serving as an interconnect, the trench portion of the interconnect extends into the first dielectric layer 14A, as shown in FIG. 3F-1.

The diffusion barrier layer 12A has been previously etched through during via definition and the formation of the spacers 12C'. Accordingly, the first and second dielectric layers 14A and 14B are protected from damage, thereby maintaining via opening 18A profile to improve device yield, performance and reliability can be improved.

Additionally, in some embodiments, following the trench etching, the exposed second adhesion promoting layer 12C may undergo isotropic etching for complete removal thereof, as shown in FIG. 3E-2. Next, a metal interconnect fills the via openings 18A, as shown in FIG. 3F-2.

According to the present invention, the dual damascene interconnect in a hybrid IMD layer may have a more mechanically robust via portion and a trench portion with lower RC, while avoiding plasma etching damage to the hybrid IMD layer with inorganic and organic portions. The method of the present invention eliminates a bottom diffusion barrier layer etching step after trench etching, avoiding etching damage to the hybrid IMD layer. Accordingly, device yield and reliability can be improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A semiconductor device, comprising:
a diffusion barrier layer, a first dielectric layer, an adhesion promoting layer and a second dielectric layer stacked sequentially on a substrate, wherein the first dielectric layer comprises at least one via opening through the diffusion barrier layer and the second dielectric layer comprises a trench opening above the via opening and through the adhesion promoting layer;
spacers in the via opening and over sidewalls of the diffusion barrier layer and the first dielectric layer, wherein the spacers and the adhesion promoting layer are formed by the same material, and the spacers have a thickness substantially equal to that of the adhesion promoting layer; and
a metal interconnect filled in the via and trench openings.

2. The semiconductor device of claim 1, wherein the diffusion barrier layer comprises silicon nitride, silicon oxynitride, silicon carbide, silicon oxycarbide, organic materials, or combinations thereof.

3. The semiconductor device of claim 1, wherein the adhesion promoting layer comprises SiN, SiON, SiC, SiOC, SiO, organic materials, or combinations thereof.

4. The semiconductor device of claim 1, wherein the first dielectric layer comprises an inorganic low k material.

5. The semiconductor device of claim 1, wherein the second dielectric layer comprises an organic low k material.

6. The semiconductor device of claim 1, wherein the first dielectric layer further comprises a recess between the trench and via openings.

7. A semiconductor device, comprising:
a diffusion barrier layer overlying a substrate;
a first adhesion promoting layer over the diffusion barrier layer;
a first dielectric layer between the diffusion barrier layer and the first adhesion promoting layer, comprising at least one via opening through the diffusion barrier layer and the first adhesion promoting layer;
spacers in the via opening and over sidewalls of the diffusion barrier layer and the first dielectric layer;
a second adhesion promoting layer overlying the first dielectric layer, wherein the spacers and the second adhesion promoting layer are formed by the same material, and the spacers have a thickness substantially equal to that of the second adhesion promoting layer;
a second dielectric layer overlying the second adhesion promoting layer, comprising a trench opening above the via opening and through the second adhesion promoting layer between the first and second dielectric layers; and
a metal interconnect filled in the via and trench openings.

8. The semiconductor device of claim 7, wherein the first dielectric layer further comprises a recess between the trench and via openings.

9. The semiconductor device of claim 7, wherein the diffusion barrier layer comprises silicon nitride, silicon oxynitride, silicon carbide, silicon oxycarbide, organic materials, or combinations thereof.

10. The semiconductor device of claim 7, wherein at least the first or second adhesion promoting layers comprises SiN, SiON, SiC, SiOC, SiO, organic materials, or combinations thereof.

11. The semiconductor device of claim 7, wherein the first dielectric layer comprises an inorganic low k material.

12. The semiconductor device of claim 7, wherein the second dielectric layer comprises an organic low k material.

13. The semiconductor device of claim 7, wherein the first adhesion promoting layer comprises a material other than the second adhesion promoting layer.

* * * * *